(12) United States Patent
Disegni et al.

(10) Patent No.: US 11,355,191 B2
(45) Date of Patent: Jun. 7, 2022

(54) METHOD FOR PROGRAMMING A PHASE-CHANGE MEMORY DEVICE OF DIFFERENTIAL TYPE, PHASE-CHANGE MEMORY DEVICE, AND ELECTRONIC SYSTEM

(71) Applicant: STMicroelectronics S.r.l., Agrate Brianza (IT)

(72) Inventors: Fabio Enrico Carlo Disegni, Spino d'adda (IT); Maurizio Francesco Perroni, Messina (IT); Cesare Torti, Pavia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 63 days.

(21) Appl. No.: 17/072,887

(22) Filed: Oct. 16, 2020

(65) Prior Publication Data

US 2021/0125668 A1 Apr. 29, 2021

(30) Foreign Application Priority Data

Oct. 29, 2019 (IT) .......................... 102019000019976

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/0004* (2013.01); *G11C 13/004* (2013.01); *G11C 2013/0042* (2013.01); *G11C 2013/0078* (2013.01); *G11C 2213/79* (2013.01)

(58) Field of Classification Search
CPC ............ G11C 13/0069; G11C 13/0004; G11C 13/003; G11C 13/004
USPC .......................................................... 365/163
See application file for complete search history.

(56) References Cited

U.S. PATENT DOCUMENTS

| 2010/0067289 | A1 | 3/2010 | Fuji | |
|---|---|---|---|---|
| 2012/0039132 | A1 | 2/2012 | Min et al. | |
| 2014/0169068 | A1* | 6/2014 | Lee | G11C 13/0069 365/148 |
| 2015/0243355 | A1* | 8/2015 | Lee | G11C 13/0069 365/148 |

* cited by examiner

*Primary Examiner* — Vu A Le
(74) *Attorney, Agent, or Firm* — Slater Matsil, LLP

(57) ABSTRACT

An embodiment method for programming a differential type phase-change memory device comprises, in a first time interval, programming a direct memory cell or the respective complementary one pertaining to a first programming driver by means of a current between SET and RESET; and, in the same first time interval, simultaneously programming a direct memory cell or the respective complementary one pertaining to a second programming driver by means of the same current between SET and RESET. The method further comprises, in a second time interval, programming the other direct memory cell or the respective complementary one pertaining to the first programming driver by means of the other current between SET and RESET; and, in the same second time interval, simultaneously programming the other direct memory cell or the respective complementary one pertaining to the second programming driver by means of the same other current between SET and RESET.

20 Claims, 11 Drawing Sheets

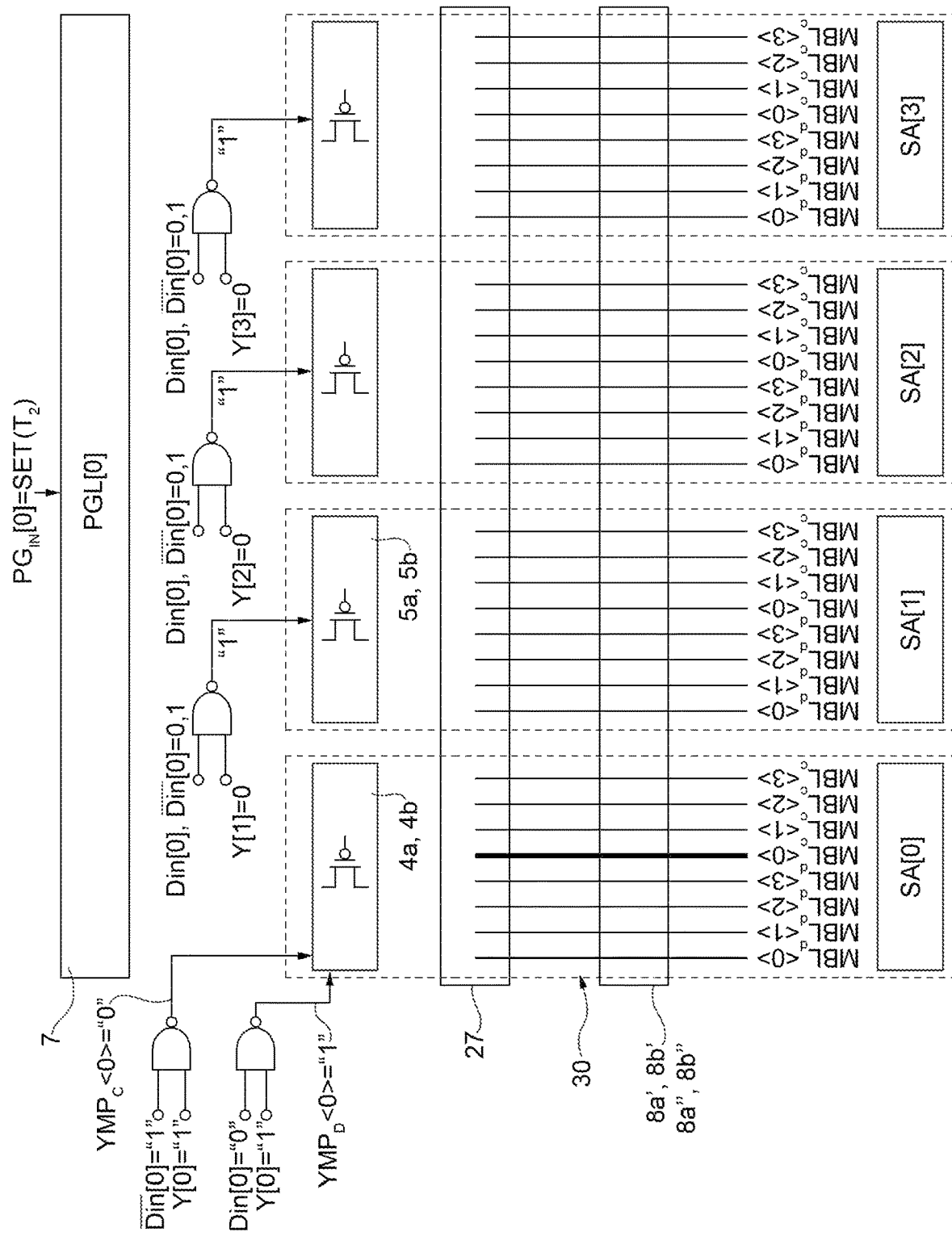

METHOD FOR PROGRAMMING A PHASE-CHANGE MEMORY DEVICE OF DIFFERENTIAL TYPE, PHASE-CHANGE MEMORY DEVICE, AND ELECTRONIC SYSTEM

CROSS-REFERENCE TO RELATED APPLICATIONS

This application claims the benefit of Italian Application No. 102019000019976, filed on Oct. 29, 2019, which application is hereby incorporated herein by reference.

TECHNICAL FIELD

The present invention relates to a method for programming a phase-change memory device of differential type, a phase-change memory device, and an electronic system including the phase-change memory device.

BACKGROUND

Phase-change non-volatile memories (so-called, "Phase Change Memory", PCM) are known, wherein, for storing information, the characteristics of materials that have the property of switching between phases having different electrical characteristics are exploited. For example, these materials may switch between an amorphous, disordered phase and an ordered crystalline or polycrystalline phase, and the two phases are associated with resistivity of a considerably different value, and consequently with a different value of a stored datum. For example, the VI group elements of the periodic table, such as Tellurium (Te), Selenium (Se), or Antimony (Sb), called chalcogenides or chalcogenic materials, are advantageously usable for forming phase-change memory cells. The phase changes are obtained by locally increasing the temperature of the chalcogenic material cells, through resistive electrodes (generally known as heaters) arranged in contact with respective regions of chalcogenic material. Selecting devices (for example MOSFET transistors) are connected to the heaters, and enable the passage of a programming electric current through a respective heater (current pulses known as "SET" and "RESET", having a respective value, depending on the phase-change intended to be generated); this electric current, due to the Joule effect, generates the temperatures needed for the phase change. During reading, the state of the chalcogenic material is detected by applying a voltage low enough so as not to cause a significant heating, and then reading the value of the current flowing in the cell. Since the current is proportional to the conductivity of the chalcogenic material, it is possible to determine which state the material is in, and thus to get the datum stored in the memory cells.

SUMMARY

In a per se known manner, non-volatile memories comprise an array of memory cells arranged in rows ("wordlines") and columns ("bitlines"); each memory cell is formed, in the case of PCM memories, by a phase-change storage element and a selector transistor, connected in series. A column decoder and a row decoder allow selection, on the basis of address logic signals received at the input and more or less complex decoding schemes, of the memory cells, and in particular the wordlines and bitlines thereof, addressed from time to time.

The column decoder comprises a plurality of analog selection switches (formed by transistors), receiving at the respective control terminals the address signals; the selection switches are arranged according to a tree structure in hierarchical levels, and their number in each hierarchical level is linked to the arrangement and size of the memory array. The selection switches, when enabled, allow the selected bitline to be set to a defined voltage and/or current value, according to the operations that is to be implemented; in particular, a current path is created between a programming stage or a reading stage and the selected bitline. This current path is defined by the series of a certain number of selection switches.

In a per se known manner, sense amplifiers carry out the reading of the data stored in the memory cells, comparing the current (or an electric quantity related thereto) that flows in the selected memory cell, also called "direct cell", with a reference current flowing in a complementary cell (so-called "double-ended" reading). Obviously, also the programming step needs to foresee the writing of the logic datum both in the direct memory cell and in the complementary cell. For example, the bit written in the complementary cell (e.g. logic "0") is associated with a RESET state, or pulse, while the same bit (e.g. logic "0") is written in the direct cell by means of a SET pulse. Each writing operation of a bit, therefore, comprises the writing of both the direct cells and the complementary cells thereof, to enable the subsequent reading step. This type of memory is known as differential memory.

In order to speed up the programming (writing) operations, it is known to write more bits in parallel, programming memory cells in parallel according to the type of pulse to be sent (RESET or SET) and by type of cell (direct or complementary). For example, the direct cells are accessed and the direct cells that are to be programmed to "0" are programmed simultaneously with the datum "0"; then, keeping the access to the direct cells active, the direct cells that are to be programmed to "1" are programmed simultaneously with the datum "1". Similarly for the complementary cells.

It is apparent that this type of approach has some disadvantages.

In fact, for writing a single direct cell, it is necessary to preselect the type of bit to be written ("1" or "0") and then generate the corresponding current pulse (SET or RESET). The generation of the corresponding current pulse (RESET or SET) related to the complementary cell thereof is then carried out. Then, the selection of the subsequent direct cell, preselecting the type of bit to be written ("1" or "0") and then generating the corresponding current pulse (SET or RESET), is carried out. Then, the programming of the complementary cell thereof is carried out. So on up to the programming of all the memory cells making up the relative word to be written.

The pulses for programming the cells in the SET and respectively RESET state have different shapes from each other; thus, for each direct cell and complementary thereof to be programmed, the current generator needs to be (re) configured so as to generate the correct pulse, with consequent time delay and stress of the circuitry thereof.

The aim of the present invention is to provide a method for programming a phase-change memory device, and a phase-change memory device, which allow to overcome the drawbacks associated with the PCM memory devices of the known type identified above, in whole or in part, and which are optimized with regards to the programming operations of the direct and complementary memory cells. The aim of the present invention is also to provide an electronic system including the phase-change memory device.

According to the present invention, a method for programming a phase-change memory, a phase-change memory device and an electronic system including the phase-change memory device, as defined in the accompanying claims, are therefore provided.

BRIEF DESCRIPTION OF THE DRAWINGS

For a better understanding of the present invention, preferred embodiments thereof are now described, purely by way of non-limiting example and with reference to the accompanying drawings, wherein:

FIGS. 3A-3C and 4A-4C illustrate an example of programming the phase-change memory according to the present invention.

DETAILED DESCRIPTION OF ILLUSTRATIVE EMBODIMENTS

Figure 1A:
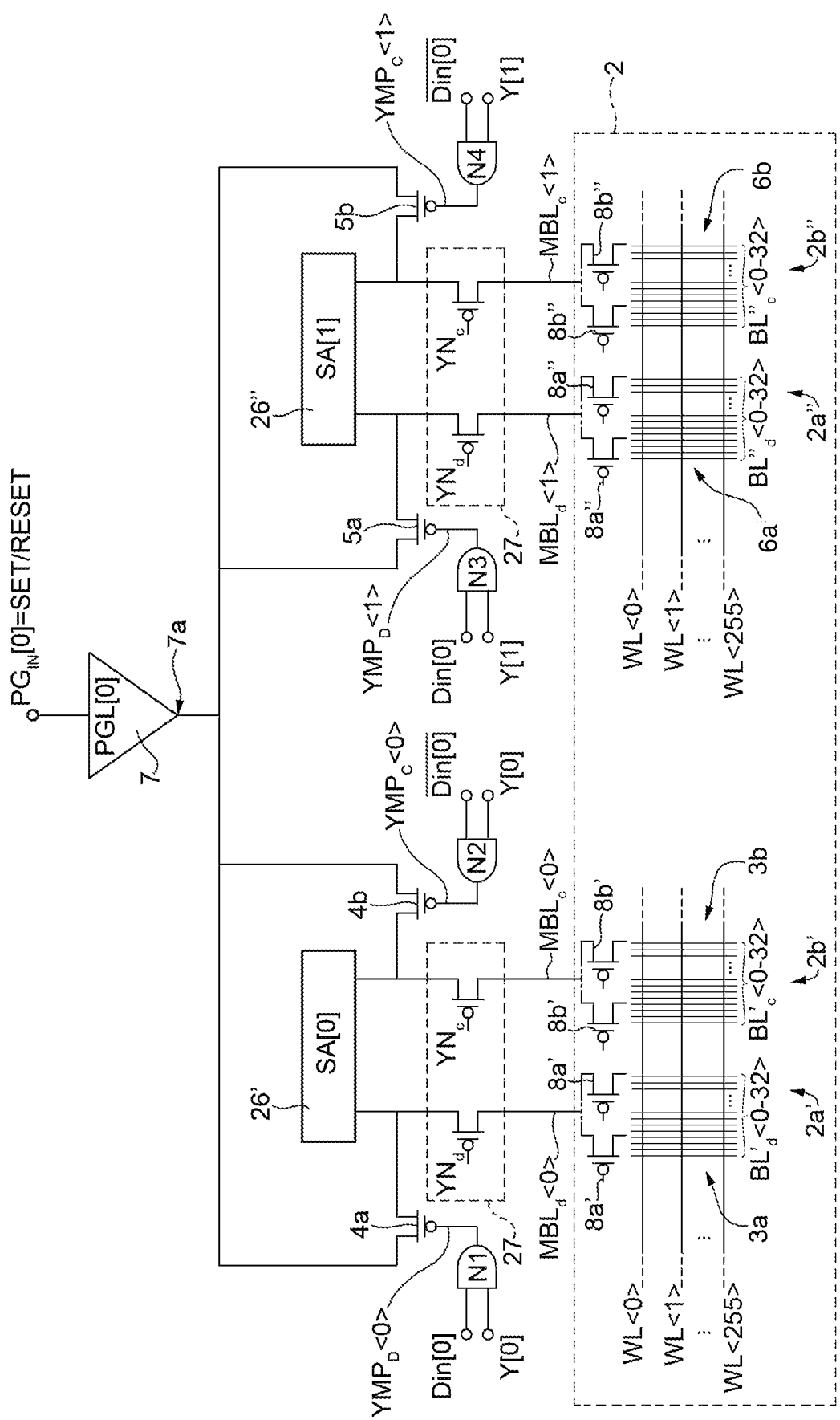
FIGS. 1A-1C show respective portions of a phase-change memory, limited to portions of interest for the understanding of the present invention.

In FIG. 1A a portion of a non-volatile memory device, in particular of phase-change type (PCM), is schematically shown and indicated in its entirety with the reference number 1, limited only to the parts necessary for the understanding of the present invention.

In particular, the memory device 1 comprises an i-th programming driver 7 (PGL[i]; that is PGL[0] with i=0) having an output 7a electrically coupled to a plurality of main bitlines by means of respective selectors 4a, 4b, 5a and 5b (here, exemplarily, p-MOS-type MOSFETs); in particular the programming driver 7 is connected to:

a main bitline $MBL_d<0>$, to which first direct memory cells 3a are connected, through the selector 4a, a main bitline $MBL_c<0>$, to which first complementary memory cells 3b (which store a datum complementary to that written in respective cells 3a) are connected, through the selector 4b, a main bitline $MBL_d<1>$, to which second direct memory cells 6a are connected, through the selector 5a, and a main bitline $MBL_c<1>$, to which second complementary memory cells 6b (which store a datum complementary to that written in respective cells 6a) are connected, through the selector 5b.

The programming driver 7 forms a programming stage of the memory device 1.

The main bitlines $MBL_d<0>$, $MBL_c<0>$ pertain, for the reading, to a same reading stage, or sense amplifier, 26'(SA [0]), while the main bitlines $MBL_d<1>$, $MBL_c<1>$ pertain, for the reading, to a same reading stage, or sense amplifier, 26" (SA[i]), through a decoding block 27 formed by the p-MOSs $YN_d$, $YN_c$ (per se not object of the present invention). FIG. 1A only qualitatively illustrates the connection of the decoding of column 27 to the main bitlines MBL< >; the actual implementation (type of connections, arrangement of the circuits for decoding, etc.) are chosen according to the specific case and are not represented here in detail as not object of the present invention and not necessary for understanding the same.

In a per se known manner, each sense amplifier 26', 26" carries out the reading of the data stored in the memory cells 3a comparing the current (or an electric quantity related thereto) flowing in a memory cell 3a selected with the reference current flowing in a respective complementary cell 3b selected (so-called "double-ended" reading).

Figure 1B:
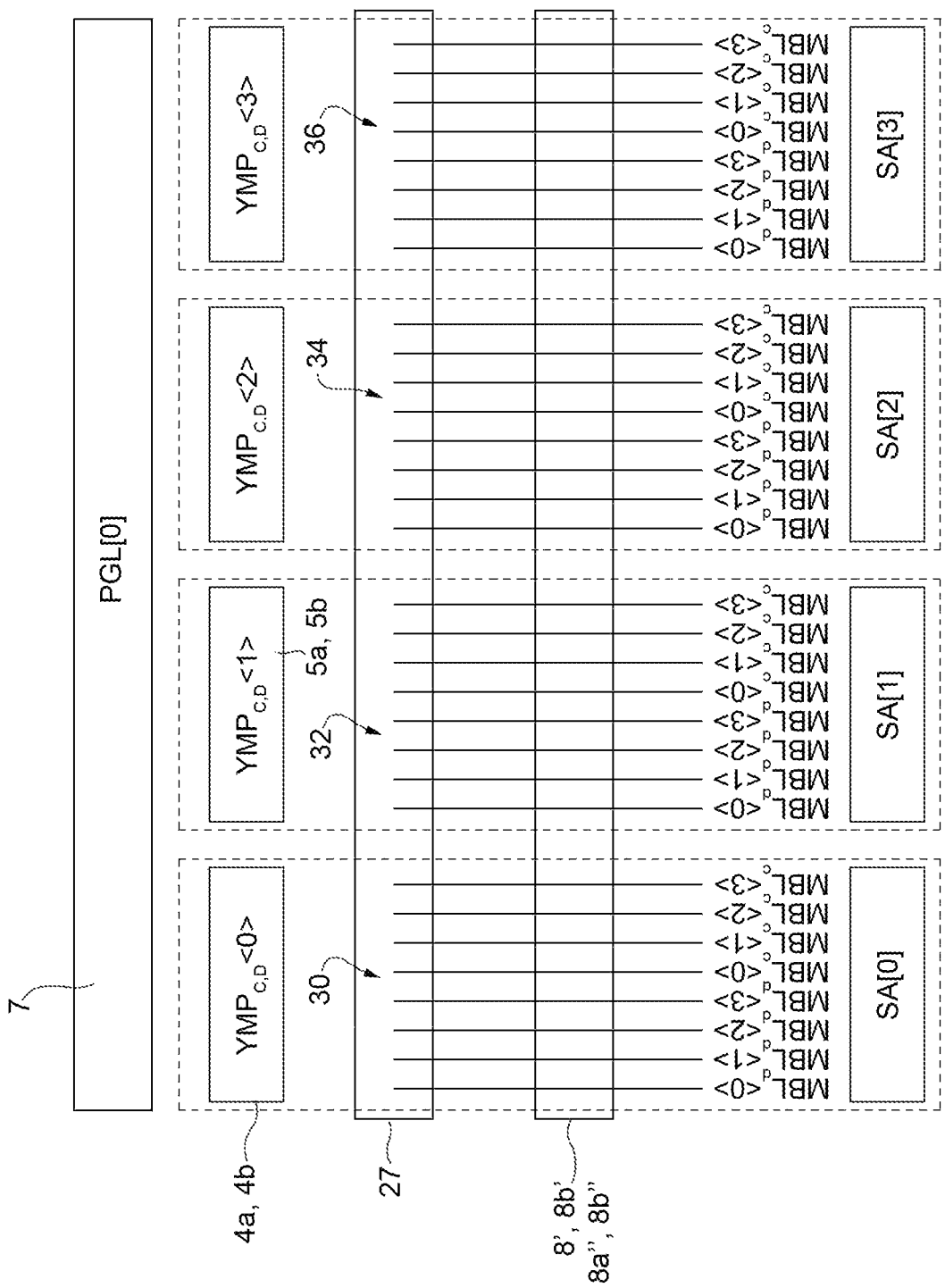

It is apparent that, in general and as illustrated in FIG. 1B, a number of main bitlines MBL< > greater than that illustrated in FIG. 1A, for example four direct main bitlines $MBL_d<0-4>$ and four corresponding complementary main bitlines $MBL_c<0-4>$ may pertain to a same sense amplifier SA< >.

Furthermore, it is noted that each programming driver 7 is associated with, and configured to program, main bitlines MBL< > pertaining to a plurality of sense amplifiers SA[0-3].

Figure 1C:
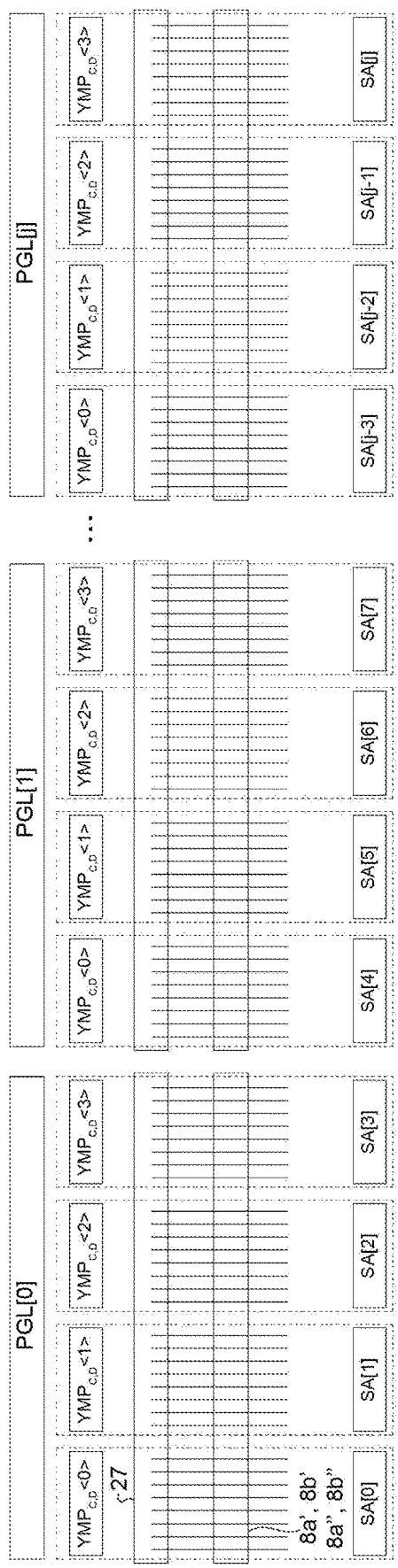

Furthermore, it is noted that, as illustrated in FIG. 1C, in a PCM memory, a plurality of structures of the type illustrated in FIG. 1B are typically present, wherein a plurality j of programming drivers PGL[0-j] is associated with, and configured to program, main bitlines MBL< > pertaining to a respective plurality of sense amplifiers SA[ ]. The value of j is equal to, or greater than, 1.

With reference again to FIG. 1A, the memory device 1 further comprises a memory array 2, including:

the first direct memory cells 3a, selectable by means of respective local wordlines WL<0>, WL<1>, ..., WL<255>, and local bitlines $BL_d'<0>$, ..., $BL_d'<32>$;

the first complementary memory cells 3b, selectable by means of the local wordlines WL<0>, WL<1>, ..., WL<255>, and respective local bitlines $BL_c'<0>$, ..., $BL_c'<32>$;

the second direct memory cells 6a, selectable by means of respective local wordlines WL<0>, WL<1>, ..., WL<255>, and local bitlines $BL_d''<0>$, ..., $BL_d''<32>$; and the second complementary memory cells 6b, selectable by means of the local wordlines WL<0>, WL<1>, ..., WL<255>, and respective local bitlines $BL_c''<0>$, ..., $BL_c''<32>$.

In FIG. 1A, the local bitlines pertaining to the direct cells are identified with the subscript "d" ($BL_d< >$), while the bitlines pertaining to the complementary cells are identified with the subscript "c" ($BL_c< >$).

In a per se known manner, the first complementary memory cells 3b correspond, for number and manufacturing characteristics, to the first direct memory cells 3a. Similarly for the direct 6a and complementary memory cells 6b. In use, the complementary memory cells 3b and 6b store a logic datum complementary to that of the direct memory cells 3a and, respectively, 6a. The first complementary memory cells 3b are accessed during the "double-ended" reading of the first direct memory cells 3a, to read the logic datum stored in the first direct memory cells 3a by comparison with the logic datum stored in respective first complementary memory cells 3b. Similarly for the reading of the second direct 6a and complementary memory cells 6b.

For greater clarity of the present description, the first direct memory cells 3a form a first memory portion 2a'; the first complementary memory cells 3b form a second memory portion 2b'; the second direct memory cells 6a form a third memory portion 2a"; and the second complementary memory cells 6b form a fourth memory portion 2b". Therefore, the first and the second memory portions 2a", 2b" store common logic information (a bit) in direct and complementary form; and the third and the fourth memory portions 2a", 2b" store respective common logic information (bit) in direct and complementary form.

The local bitlines $BL_d'<0>$-$BL_d'<32>$ of the first memory portion 2a' are connected to the main bitline $MBL_d<0>$; the local bitlines $BL_c'<0>$-$BL_c'<32>$ of the second memory portion 2b' are connected to the main bitline $MBL_c<0>$; the local bitlines $BL_d"<0>$-$BL_d"<32>$ of the third memory portion 2a" are connected to the main bitline $MBL_d<1>$; and the local bitlines $BL_c"<0>$-$BL_c"<32>$ of the fourth memory portion 2b" are connected to the main bitline $MBL_c<1>$.

The memory cells 3a, 3b, 6a, 6b are identical to each other and comprise a phase-change element and a selector element, operatively coupled thereto (not shown in detail). The phase-change element includes a phase-change material (for example a chalcogenide), and is thus capable of storing data in the form of resistance levels associated with the different phases assumed by the phase-change material (it therefore operates as a resistor with variable resistance). The selector element is, for example, a MOS transistor having a gate connected to the respective wordline WL< >, a first conduction terminal connected to the phase-change element, and a second conduction terminal connected to a reference potential (for example to ground). The selector element may be controllable so as to allow, when selected (that is, switched on by the signal of the respective local wordline WL< > to which it is coupled), the passage of a writing/reading current through the phase-change element during the respective operation of writing/reading a logic datum in this phase-change element.

The non-volatile memory device 1 further comprises a row decoder (not shown in detail here), adapted to select the local wordline WL< > corresponding to the memory cell 3a, 3b, 6a, 6b to be addressed from time to time, and a column decoder (not shown here), adapted to select the bitline of the memory cell 3a, 3b, 6a, 6b to be addressed. Given the array structure, the activation of a local wordline WL< > and a local bitline $BL_{d,c}<>$ allows to uniquely select one and only one memory cell 3a, 3b, 6a, 6b.

In writing, the selectors 4a, 4b, 5a, 5b are controlled in conduction and cut-off according to the need to access the respective main bitline $MBL_{d,c}<>$ for programming the memory cells 3a, 3b, 6a, 6b connected thereto.

The programming driver 7 is formed in a per se known manner, for example by means of a current mirror, and receives as input a current signal $PG_{IN}[i]$ representing the logic datum to be written ("1" or "0").

The selectors 4a and 4b, and 5a and 5b receive control signals YMP<0>, YMP<1> at the respective control terminals; further selection switches 8a', 8b', 8a", 8b" (of the p-MOS type) are foreseen, in a per se known manner, for selecting/deselecting the bitlines $BL_{d,c}<>$ of the memory portions 2a', 2b', 2a", 2b".

In general, the selection switches are arranged according to a tree structure in hierarchical levels, and their number in each hierarchical level is linked to the arrangement and size of the memory array. The selectors 4a, 4b, 5a, 5b, as well as the selection switches 8a', 8b', 8a", 8b", when enabled, allow the selected bitline to be set to a defined voltage and/or current value, according to the operations intended to be implemented; in particular, a current path is created between the programming stage and the selected bitline.

Figure 2:
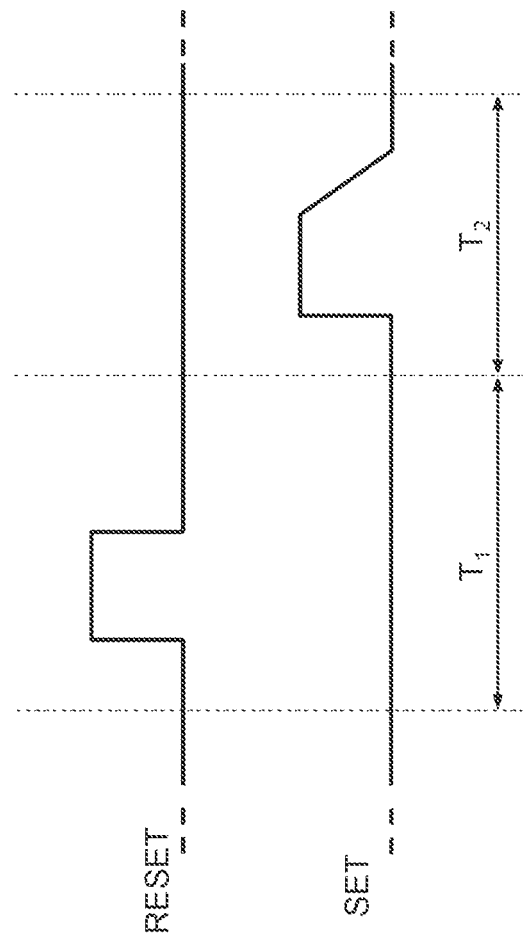
FIG. 2 illustrates a time diagram during which the writing of a logic word in the non-volatile memory device of FIGS. 1A-1C occurs, according to an aspect of the present invention.

The present invention foresees that the programming of the memory cells 3a, 3b, 6a, 6b occurs according to the scheme illustrated in FIG. 2.

The memory cells are programmed by bit "words", that is by selecting and writing memory cells belonging to the same wordline WL<0>, WL<1>, etc. What described hereinafter applies therefore to the writing of a word in a respective wordline, for example in the wordline WL<0>.

As illustrated in FIGS. 1B and 1n FIG. 1C, four eight-main-bitline (of which four are direct and four complementary) groups are associated with each programming driver PGL[0-j]. Each eight-main-bitline group pertains to a respective sense amplifier SA[ ].

The programming of a memory cell by the programming driver PGL[0] occurs by uniquely selecting the address of this memory cell, that is activating only one of the signals YMP<0>-YMP<3> to select the main bitline thereof, and selecting the memory cell to be programmed with the row and column decoding. The programming of a memory cell by the programming driver PGL[1] occurs in a similar way, and so on for all the programming drivers PGL[j].

With reference to FIG. 2, in a time interval T1, a RESET pulse is generated, that is an electric pulse adapted to program the memory cells addressed in the logic state "0".

To this end, in the time interval T1, all and only the selectors 4a, 4b, 5a, 5b are activated, which are coupled to main bitlines $MBL_d<0>$, $MBL_c<0>$, $MBL_d<1>$ and $MBL_c<1>$ through which the RESET signal is passed.

The writing of logic data occurs by words, that is by writing a same wordline. This means that, if the wordline WL<0> is being written, all and only the memory cells 3a, 3b, 6a, 6b arranged along the wordline WL<0>, regardless the programming driver PGL[i], will be programmed; the remaining wordlines WL<1>-WL<255> are not selected. For example, with reference to FIG. 1A, if it is desired to write the RESET logic datum in the cell 3a addressed by the pair (row, column)=(WL<0>, $BL_d<32>$), the selector 4a will be switched on (acting on the signal YMP<0>), while the selectors 4b, 5a and 5b will be switched off. Simultaneously, the memory cell 3a thereof will be addressed acting on the signals WL<0>, $BL_d<32>$, in a per se known manner and depending on the column decoding (which is not object of the present invention). The logic datum to be written is represented by the signal $PG_{IN}[i]$ which is provided to the driver 7.

FIGS. 3A-3C and 4A-4C illustrate an example of programming the PCM memory according to the present invention.

According to an aspect of the present invention, switching on the selectors 4a and 5a, as well as switching off the selectors 4b and 5b, are controlled by respective signals generated at the output by a respective NAND logic gate.

A NAND logic gate is thus present for each main bitline $MBL_{d,c}<>$; the output of each NAND logic gate is coupled to the control terminal of a respective selector 4a, 4b, 5a, 5b, to switch on/off the selector thereof so as to couple/decouple the respective main bitline $MBL_{d,c}<>$ to/from the programming driver 7.

With exemplary reference to FIG. 1A, there are thus four NAND logic gates $N_1$-$N_4$, each adapted to output a respective signal among the signals $YMP_D<0>$ (applied to the selectors 4a and 5a coupled to the direct main bitlines $MBL_d<0-1>$) and $YMP_C<0>$ (applied to the selectors 4b and 5b coupled to the complementary main bitlines $MBL_c<0-1>$).

The NAND logic gates $N_1$ and $N_3$, coupled to the selectors of the direct main bitlines $MBL_d<0-1>$, receive at the input a first control signal $D_{IN}[0]$ and a second control signal Y[0]. The NAND logic gates $N_2$ and $N_4$, coupled to the selectors of the complementary main bitlines $MBL_c<0-1>$, receive at the input the negated logic value/$D_{IN}[0]$ of the first control signal $D_{IN}[0]$ and the second control signal Y[0].

In a manner not shown in figure, but per se apparent to the person skilled in the art, the output of each NAND gate $N_1$-$N_4$ may be provided at the input to a buffer adapted to regulate the amplitude of the signal supplied to the respective selector 4a, 4b, 5a, 5b, to control the switching on/off of the latter. The buffer output is therefore the signal, $YMP_{D,C}<0>$.

The first control signal $D_{IN}[0]$ is raised to "1" ($D_{IN}[0]$="1", $/D_{IN}[0]$="0") if the datum to be written $PG_{IN}[0]$ is to be written in the direct memory portion (portion 2a' or 2a"); conversely, the first control signal $D_{IN}[0]$ is set to "0" and thus its negated/$D_{IN}[0]$ to "1" ($D_{IN}[0]$="0", $/D_{IN}[0]$="1") if the datum to be written $PG_{IN}[0]$ is to be written in the complementary memory portion (portion 2b' or 2b"). The control signal $D_{IN}[0]$ is common to all the selectors 4a, 5a coupled to the direct main bitlines $MBL_d<0$-1> related to a same programming driver (here, PGL[0]). The control signal/$D_{IN}[0]$ is common to all the selectors 4b, 5b coupled to the complementary main bitlines $MBL_c<0$-1> related to a same programming driver (here, PGL[0]).

The second control signal Y[0] identifies the group of main bitlines that are to be coupled to the programming driver PGL[0]. The main bitlines pertaining to a same sense amplifier SA[ ] form the group of main bitlines. This aspect may be better observed with reference to FIG. 1B.

In other words, with reference for example to FIG. 1B:
- the main bitlines $MBL_{d,c}<$ > pertaining to the sense amplifier SA[0] form a first group 30 of main bitlines, which are electrically coupled to the programming driver PGL[0] switching on the selectors 4a, 4b, 5a, 5b when the output $YMP_{D,C}<0>$ from the NAND logic gate thereof is "0" (it is reminded that, in fact, that the selectors 4a, 4b, 5a, 5b are p-MOSs). The output "0" from the respective NAND logic gate occurs when $D_{IN}[0]$="1" for the direct main bitlines or when /$D_{IN}[0]$="1" for the complementary ones and, simultaneously, when Y[0]="1";
- the main bitlines $MBL_{d,c}<$ > pertaining to the sense amplifier SA[1] form a second group 32 of main bitlines, which are electrically coupled to the programming driver PGL[0] switching on the selectors 4a, 4b, 5a, 5b when the output $YMP_{D,C}<1>$ from the NAND logic gate thereof is "0". The output "0" from the respective NAND logic gate occurs when $D_{IN}[0]$="1" for the direct main bitlines or when/$D_{IN}[0]$="1" for the complementary ones and, simultaneously, when Y[1]="1";
- the main bitlines $MBL_{d,c}<$ > pertaining to the sense amplifier SA[2] form a third group 34 of main bitlines, which are electrically coupled to the programming driver PGL[0] switching on the selectors 4a, 4b, 5a, 5b when the output $YMP_{D,C}<2>$ from the NAND logic gate thereof is "0". The output "0" from the respective NAND logic gate occurs when $D_{IN}[0]$="1" for the direct main bitlines or when/$D_{IN}[0]$="1" for the complementary ones and, simultaneously, when Y[2]="1"; and
- the main bitlines $MBL_{d,c}<$ > pertaining to the sense amplifier SA[3] form a fourth group 36 of main bitlines, which are electrically coupled to the programming driver PGL[0] switching on the selectors 4a, 4b, 5a, 5b when the output $YMP_{D,C}<3>$ from the NAND logic gate thereof is "0". The output "0" from the respective NAND logic gate occurs when $D_{IN}[0]$="1" for the direct main bitlines or when/$D_{IN}[0]$="1" for the complementary ones and, simultaneously, when Y[3]="1".

The signal $YMP_D<0>$ outputted by the respective NAND logic gate is given by $NOT(D_{IN}[0]$ AND Y[0])=NOT("1" AND "1")="0". The signal $YMP_C<0>$ output by the respective NAND logic gate is given by $NOT(/D_{IN}[0]$ AND Y[0])=NOT("0" AND "1")="1".

What described with reference to FIGS. 3A-3C and 4A-4C applies to the writing of a word in a respective wordline (for example in the wordline WL<0>), programming to SET or RESET a direct memory cell 3a, or a complementary one 3b, belonging to this wordline. The programming occurs by means of the programming drivers PGL[0-j], which receive at the input the SET/RESET pulse and transfer it to the main bitlines $MBL_{d,c}<0, 1, \ldots>$ coupled thereto. It is apparent that the SET/RESET programming pulse may be transferred to the main bitlines $MBL_{d,c}<0, 1, \ldots>$ only when the latter are electrically coupled or connected to the respective programming driver PGL[0-j], that is when the selector 4a, 4b, 5a, 5b thereof is on (conducting). Furthermore, it is apparent that the electric path through which the SET/RESET programming pulse propagates, until it reaches the memory cell to be programmed, is established when the memory cell to be programmed is properly addressed by means of the column decoding (in a per se known manner, that is selecting a local bitline BL< > and a wordline WL< > corresponding to this memory cell).

Figure 3A:
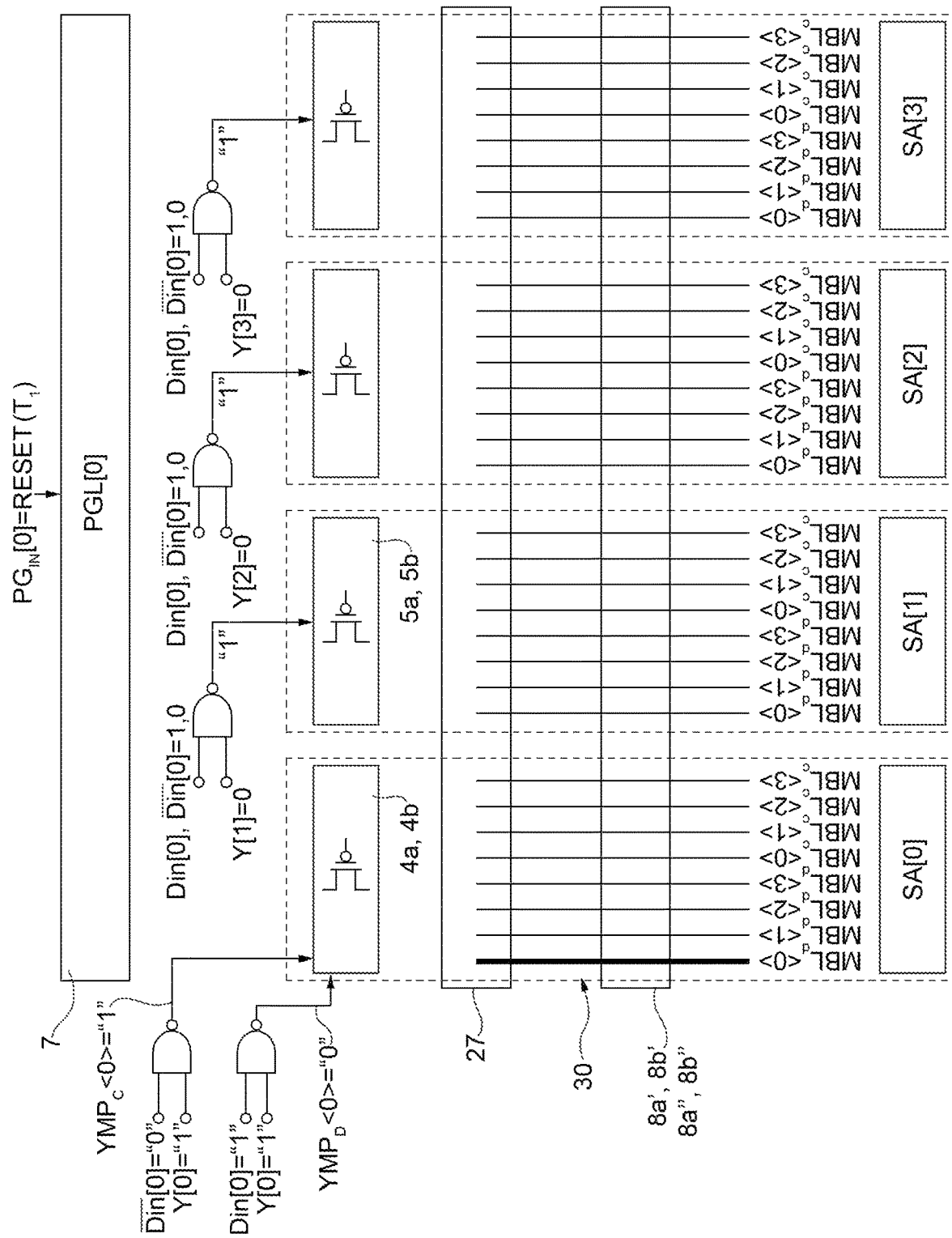

FIG. 3A illustrates programming operations of a direct memory cell 3a in the interval T1 of FIG. 2, by means of the programming driver PGL[0]. The memory cell 3a to be programmed is coupled to the main bitline $MBL_d<0>$ and the latter belongs to the bitline group 30, pertaining to the sense amplifier SA[0].

Therefore, with reference to FIG. 3A, to write the datum $PG_{IN}[0]$=RESET in the memory cell 3a, the first control signals are $D_{IN}[0]$="1", /$D_{IN}[0]$="0", and the second control signals are Y[0]="1", Y[1]="0", Y[2]="0", Y[3]="0". The control signal $D_{IN}[1]$="1" identifies the fact that a direct cell is to be programmed. The control signal Y[0]="1" identifies the fact that this cell to be programmed is coupled to a main bitline pertaining to the sense amplifier SA[0].

In this way, only the direct main bitlines $MBL_d<0, 1, \ldots>$ belonging to the group 30 are electrically connected to the programming driver PGL[0] since the selectors 4a, 5a thereof are on, while all the remaining complementary main bitlines $MBL_c<0, 1, \ldots>$ are decoupled from the programming driver PGL[0], since the selectors 4b, 5b thereof are off.

By means of column decoding, and in a per se known manner, the memory cell 3a to be programmed (that is selecting the bitline BL< > and the wordline WL< > connected to this memory cell 3a) is then uniquely addressed.

The programming signal $PG_{IN}[0]$=RESET may thus flow through the only main bitline $MBL_d<0>$ and, through the local bitline, reach the memory cell 3a addressed, programming it.

Figure 3B:
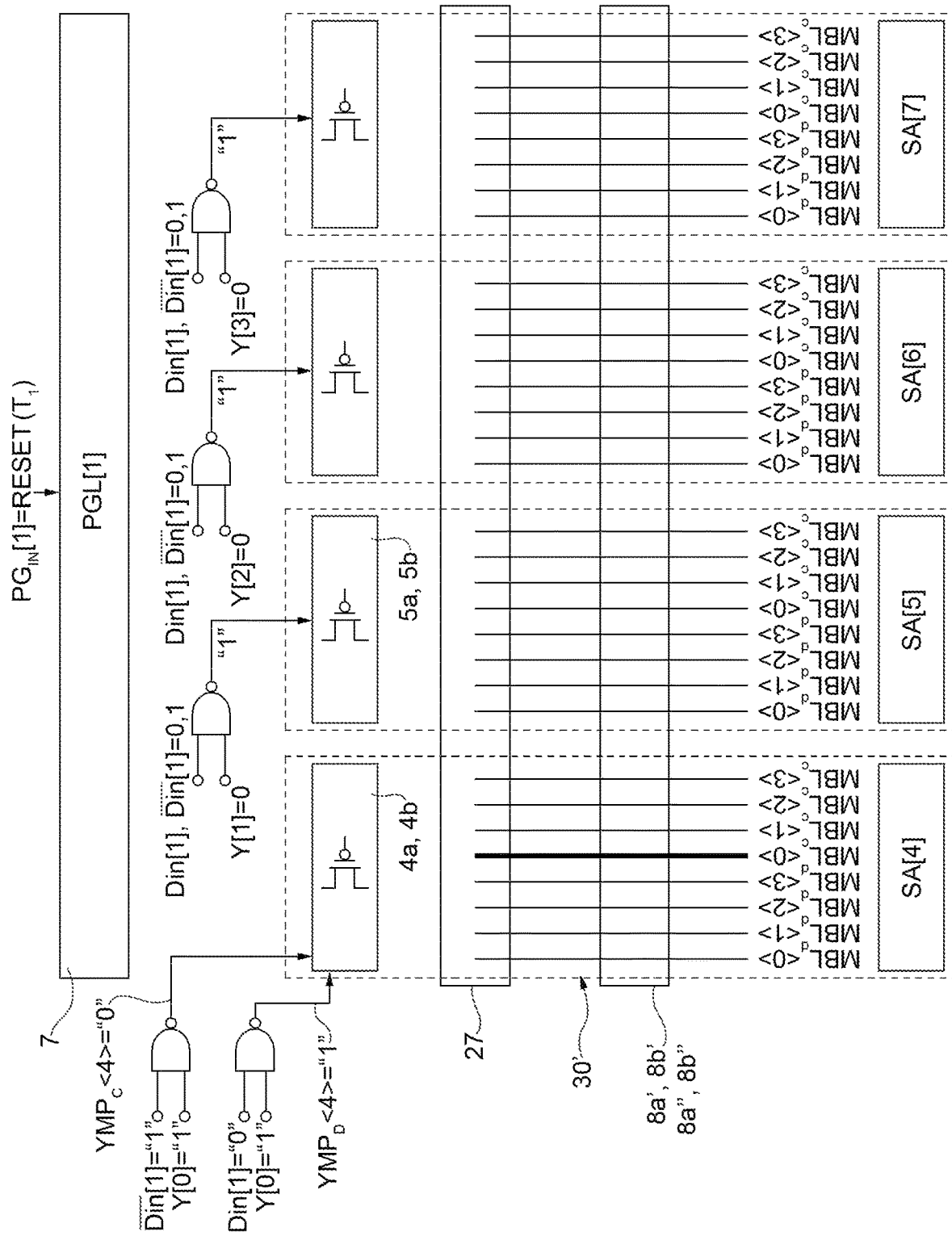

FIG. 3B illustrates RESET programming operations of a complementary memory cell 3b in the interval T1 of FIG. 2, by means of the programming driver PGL[1] (therefore further and distinct with respect to the programming driver PGL[0]). The programming of the memory cell 3b occurs thus simultaneously with the programming of the memory cell 3a of FIG. 3A, exploiting the fact that both memory cells are to be programmed to RESET. The memory cell 3b here considered is coupled to the main bitline $MBL_c<0>$ belonging to the bitline group 30', which pertains to the sense amplifier SA[4].

With reference to FIG. 3B, to write the datum $PG_{IN}$[1]=RESET in the memory cell 3b, the first control signals are $D_{IN}$[1]="0", /$D_{IN}$[1]="1", and the second control signals are Y[0]="1", Y[1]="0", Y[2]="0", Y[3]="0". The control signal /$D_{IN}$[1]="1" identifies the fact that a complementary cell is to be programmed. The control signal Y[0]="1" identifies the fact that this cell to be programmed is coupled to a main bitline pertaining to the sense amplifier SA[4].

In this way, only the complementary main bitlines $MBL_c$<0, 1, ... > belonging to the group 30' are electrically connected to the programming driver PGL[1], since the selectors 4b, 5b thereof are on, while all the remaining direct main bitlines $MBL_d$<0, 1, ... > are decoupled from the programming driver PGL[1], since the selectors 4a, 5a thereof are off.

By means of column decoding, and in a per se known manner, the memory cell 3b to be programmed (that is selecting the bitline BL< > and the wordline WL< > relating to this memory cell) is then uniquely addressed.

The programming signal $PG_{IN}$[1]=RESET may thus flow through the main bitline $MBL_c$<0> to which the memory cell to be programmed is coupled, and through the local bitline BL< > to which the memory cell 3b to be programmed is coupled, reaching and programming this memory cell 3b.

Figure 3C:
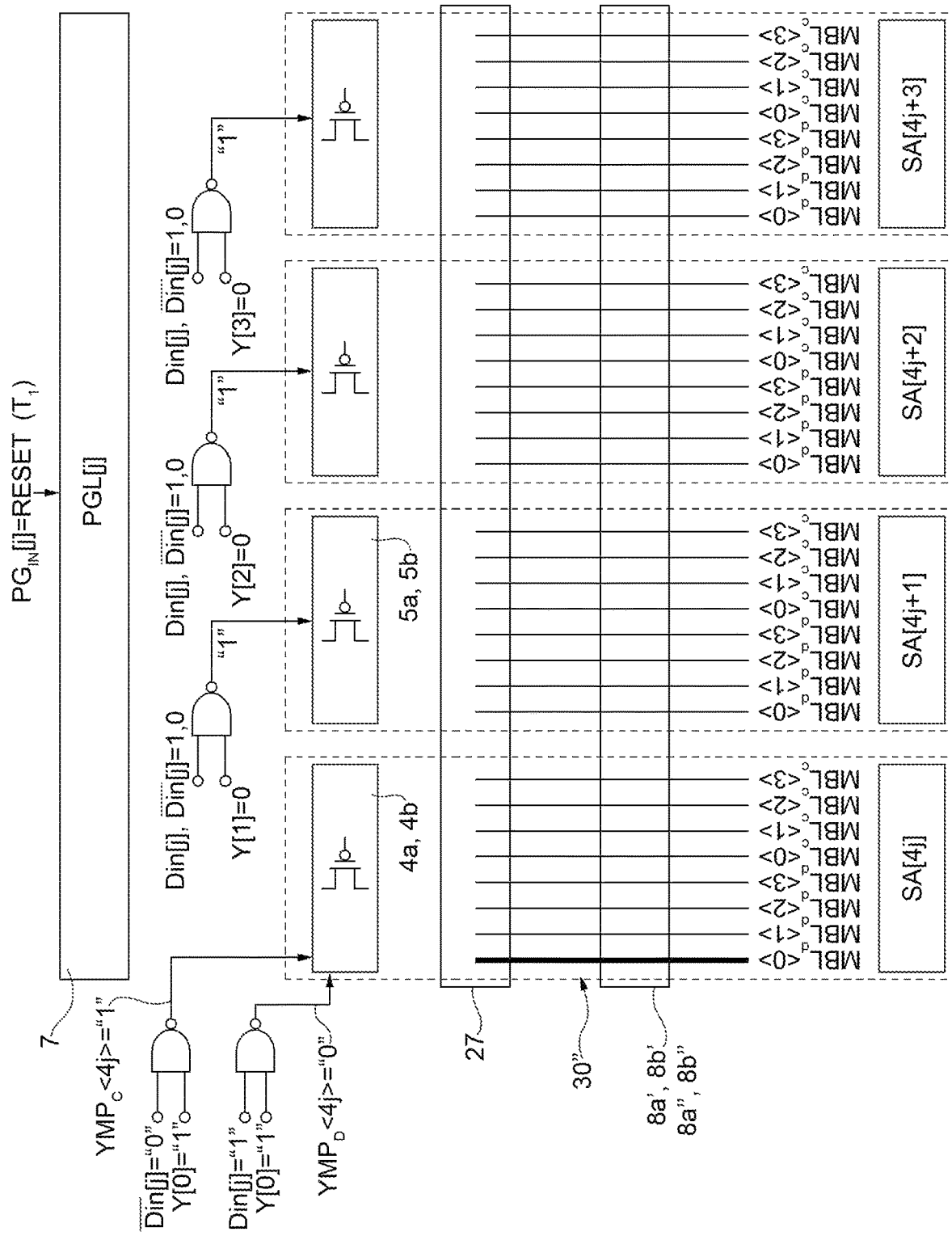

FIG. 3C illustrates programming operations of a direct memory cell 3a in the interval T1 of FIG. 2, by means of the programming driver PGL[j] (therefore further and distinct with respect to the programming drivers PGL[0] and PGL[1]). The programming of this memory cell 3a occurs thus simultaneously with the programming of the memory cells 3a and 3b of FIGS. 3A and 3B, exploiting the fact that all these memory cells are to be programmed to RESET. The memory cell 3a here considered is coupled to the main bitline $MBL_c$<0> belonging to the bitline group 30", which pertains to the sense amplifier SA[4j].

With reference to FIG. 3C, to write the datum $PG_{IN}$[j]=RESET in the memory cell 3a, the first control signals are $D_{IN}$[j]="1", /$D_{IN}$[j]="0", and the second control signals are Y[0]="1", Y[1]="0", Y[2]="0", Y[3]="0". The control signal /$D_{IN}$[j]="1" identifies the fact that a direct cell is to be programmed. The control signal Y[ ]="1" identifies the fact that this cell to be programmed is coupled to a main bitline pertaining to the sense amplifier SA[4j].

In this way, only the direct main bitlines $MBL_d$<0, 1, ... > belonging to the group 30" are electrically connected to the programming driver PGL[j], since the selectors 4a, 5a thereof are on, while all the remaining complementary main bitlines $MBL_c$<0, 1, ... > are decoupled from the programming driver PGL[j], since the selectors 4b, 5b thereof are off.

By means of column decoding, and in a per se known manner, the memory cell 3a to be programmed (that is selecting the bitline BL< > and the wordline WL< > relating to this memory cell) is then uniquely addressed.

The programming signal $PG_{IN}$[j]=RESET may thus flow through the main and local bitlines to which the memory cell 3a addressed is coupled, reaching and programming this memory cell 3a addressed.

In conclusion, during the interval T1, the RESET programming signal is provided simultaneously by each programming driver PGL[0-j] to a respective memory cell which is to be programmed to RESET, regardless of whether this memory cell is a direct memory cell or a complementary memory cell.

Figure 4B:
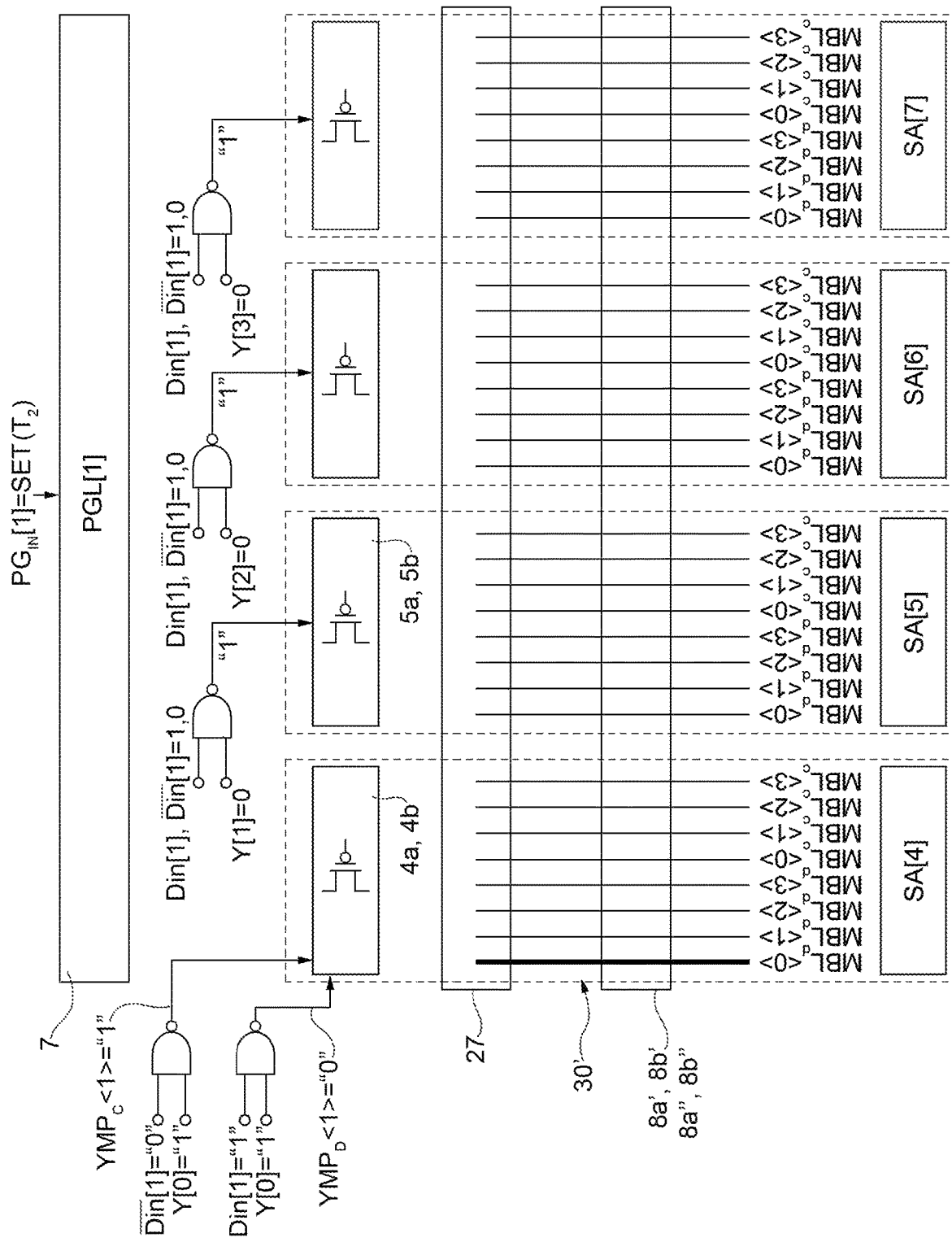
Figure 4C:
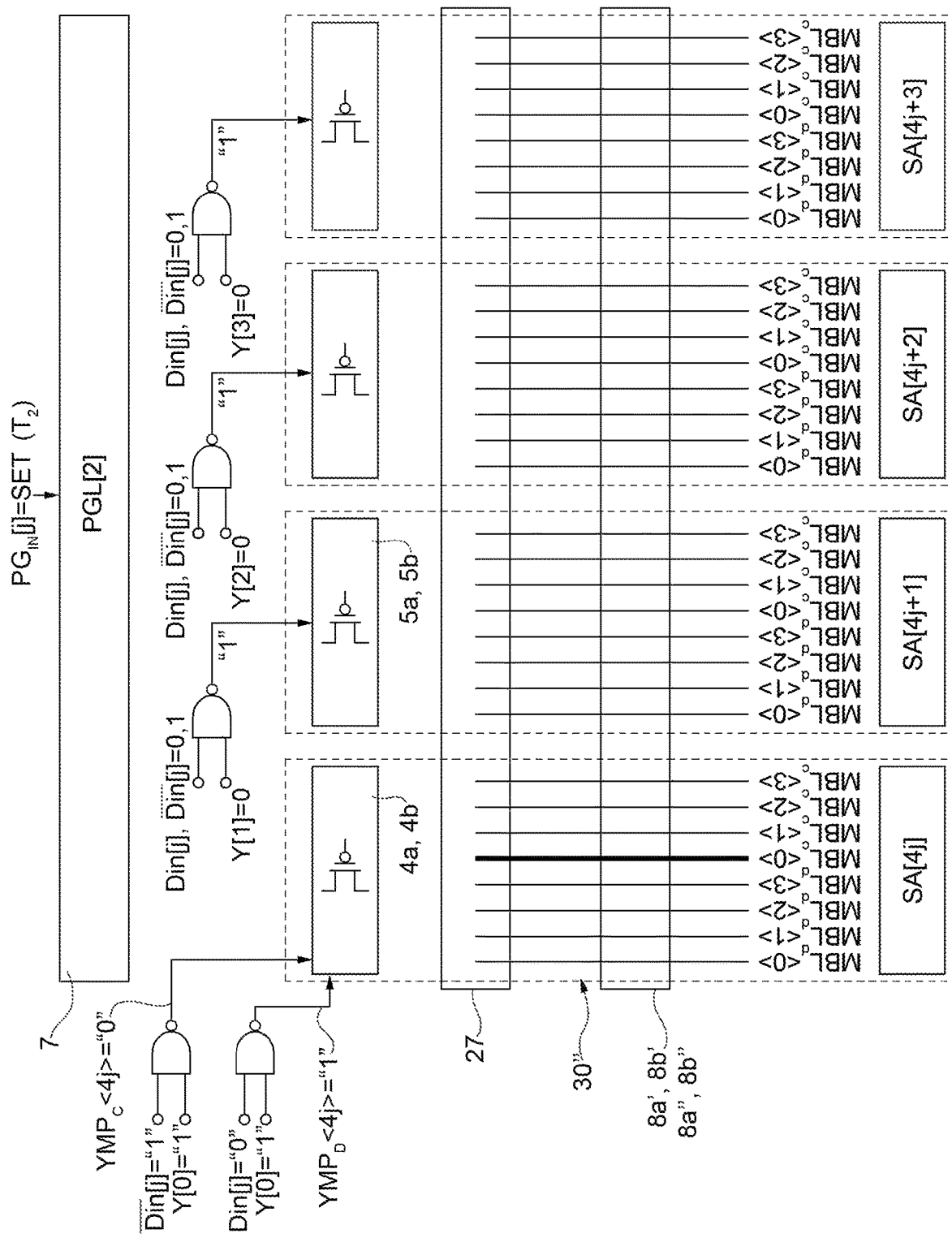

Similarly, during the time interval T2 of FIG. 2, wherein a SET pulse is generated, the SET programming signal is provided simultaneously by each programming driver PGL[0-j] to a respective memory cell which is to be programmed to SET, regardless of whether this memory cell is a direct memory cell or a complementary memory cell, as illustrated in FIGS. 4A-4C.

FIG. 4A illustrates programming operations, in the interval T2, of a memory cell 3b complementary to the memory cell 3a programmed in the step of FIG. 3A. Therefore, with reference to FIG. 4A, to write the datum $PG_{IN}$[0]=SET in the memory cell 3b (complementary cell), coupled to the main bitline $MBL_c$<0> belonging to the group 30 pertaining to the sense amplifier SA[0], the first control signals are $D_{IN}$[0]="0", /$D_{IN}$[0]="1", and the second control signals are Y[0]="1", Y[1]="0", Y[2]="0", Y[3]="0".

In this way, only the complementary main bitlines $MBL_c$<0, 1, ... > belonging to the group 30 are electrically connected to the programming driver PGL[0] as the selectors thereof are on, while all the remaining direct main bitlines $MBL_d$<0, 1, ... > are decoupled from the programming driver PGL[0] as the selectors thereof are off.

By means of column decoding, and in a per se known manner, the memory cell 3b to be programmed (that is selecting the bitline BL< > and the wordline WL< > relating to this memory cell) is then uniquely addressed.

The programming signal $PG_{IN}$[0]=SET may thus flow through the main and local bitlines to which the memory cell 3b addressed is connected, reaching and programming this memory cell 3b addressed.

FIG. 4B illustrates programming operations by means of the programming driver PGL[1], in the interval T2, of a direct memory cell 3a corresponding to the complementary cell 3b programmed in the step of FIG. 3B. In other words, the cell 3b programmed in the step of FIG. 3B contains a datum complementary to the datum foreseen for the cell 3a which is programmed in the step of FIG. 4B. With reference to FIG. 4B, to write the datum $PG_{IN}$[1]=SET in the memory cell 3a, coupled to the main bitline $MBL_d$<0> belonging to the group 30' pertaining to the sense amplifier SA[4], the first control signals are $D_{IN}$[1]="1", /$D_{IN}$[1]="0", and the second control signals are Y[0]="1", Y[1]="0", Y[2]="0", Y[3]="0".

In this way, only the direct main bitlines $MBL_d$<0, 1, ... > belonging to the group 30' are electrically connected to the programming driver PGL[1] as the selectors thereof are on, while all the remaining complementary main bitlines $MBL_c$<0, 1, ... > are decoupled from the programming driver PGL[1] as the selectors thereof are off.

By means of column decoding, and in a per se known manner, the memory cell 3a to be programmed (that is selecting the bitline BL< > and the wordline WL< > relating to this memory cell) is then uniquely addressed.

The programming signal $PG_{IN}$[1]=SET may thus flow through the main and local bitlines to which the memory cell 3a addressed is connected, reaching and programming this memory cell 3a addressed.

FIG. 4C illustrates programming operations, by means of the programming driver PGL[j], in the interval T2, of a memory cell 3b which is complementary to the memory cell 3a programmed in the step of FIG. 3C. With reference to FIG. 4C, to write the datum $PG_{IN}$[j]=SET in a memory cell 3b, coupled to the main bitline $MBL_c$<0> belonging to the group 30" pertaining to the sense amplifier SA[4j], the first control signals are $D_{IN}$[j]="0", /$D_{IN}$="1", and the second control signals are Y[0]="1", Y[1]="0", Y[2]="0", Y[3]="0".

In this way, only the complementary main bitlines $MBL_c$<0, 1, ... > belonging to the group 30" are electrically connected to the programming driver PGL[j] as the selectors thereof are on, while all the remaining direct main bitlines MBL$_d$<0, 1, . . . > are decoupled from the programming driver PGL[j] as the selectors thereof are off.

By means of column decoding, and in a per se known manner, the memory cell 3b to be programmed (that is selecting the bitline BL<> and the wordline WL<> relating to this memory cell) is then uniquely addressed.

The programming signal PG$_{IN}$[j]=SET may thus flow through the main and local bitlines to which the memory cell 3b addressed is connected, reaching and programming this memory cell 3b addressed.

In conclusion, proceeding as illustrated and described with reference to FIGS. 3A-3C and 4A-4C, the programming of the direct memory cells and the respective complementary ones is completed in only two time instants (T1 and T2).

The programming of subsequent memory cells belonging to the same word being written is then carried out, according to steps similar to those illustrated with reference to FIGS. 3A-3C and 4A-4C, until the writing of the world is completed. In fact, this means that the next Y[ ] signal is activated (e.g. from Y[0]=1, Y[1]=0, Y[2]=0, Y[3]=0, to Y[0]=0, Y[1]=1, Y[2]=0, Y[3]=0, and so on).

The same steps described herein above are then repeated for all the direct and complementary main bitlines pertaining to a same sense amplifier SA[0, . . . , 4j+3], and for all the sense amplifiers SA[ ] managed by a same programming driver PGL[0, . . . , j]. The SET and RESET signals generated in time intervals T2 and respectively T1 are supplied to all the programming drivers PGL[0, . . . , j] in the respective time intervals, and transferred to each memory cell to be programmed using a signal (Din[0, . . . , j], /Din [0, . . . , j]) identifying the type of direct or complementary cell and a signal (Y[0-3]) identifying the group of main bitlines to which this memory cell to be programmed is coupled.

Being the datum differential (if the direct is at SET, the complementary is at RESET, and vice versa) the maximum parallelism is always exploited, because whatever the datum, there will be a number of cells to be programmed to RESET equal to the number of bits in the word, and similarly a number of cells to be programmed to SET equal to the number of bits in the word.

In the interval T1, no SET pulse is generated. In the interval T2 no RESET pulse is generated.

The signals D$_{in}$[0, 1, . . . ] and the respective negated are generated by a controller (not shown) according to the memory cell to be programmed, in a per se apparent manner to the skilled in the art. Similarly, also the signals Y[0, 1, . . . ] are generated based on the memory cell to be programmed, in a per se apparent manner to the skilled in the art.

Figure 5:
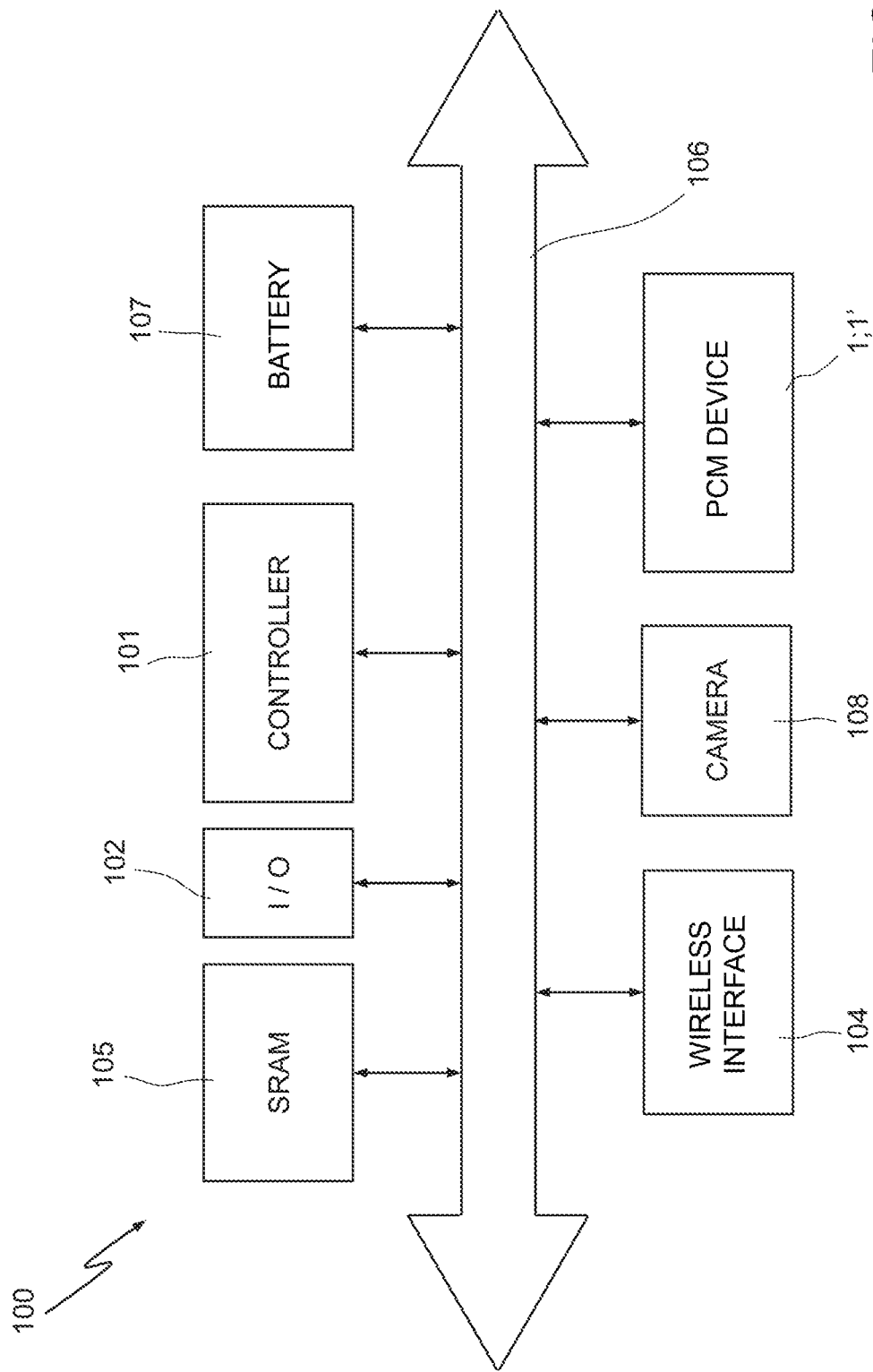
FIG. 5 is a simplified block diagram of an electronic system incorporating the non-volatile memory device, in an embodiment of the present invention.

FIG. 5 shows a portion of an electronic system 100, according to a further embodiment of the present invention. The electronic system 100 may be used in electronic devices, such as for example: a PDA (Personal Digital Assistant); a laptop or desktop computer, possibly capable of wireless data transfer; a cell phone; a digital audio player; a camera; or further devices capable of processing, storing, transmitting and receiving information.

In detail, the electronic system 100 comprises: a controller 101 (for example provided with a microprocessor, a DSP, or a microcontroller); an input/output device 102 (for example provided with a keyboard and a display), for entering and displaying data; the memory device 1 (according to any one of the embodiments of FIGS. 1A-1C); a wireless interface 104, for example an antenna, for transmitting and receiving data through a radio-frequency wireless communication network; and a RAM memory 105, all coupled through a bus 106. A battery 107 may be used as an electrical power source in the electronic system 100, which may also be equipped with a camera 108.

From what previously described and illustrated, the advantages that the present invention allows to obtain are evident.

In particular, the memory programming (writing) time is considerably reduced. This also allows reduction of the stress the memory and peripheral circuits are subjected to.

Finally, it is clear that modifications and variations may be made to what is described and illustrated herein without thereby departing from the scope of protection of the present invention, as defined in the attached claims.

What is claimed is:

1. A method for programming a differential-type phase-change memory device, the differential-type phase-change memory device comprising:
    a plurality of phase-change memory cells;
    a first programming driver of respective phase-change memory cells;
    a second programming driver of respective phase-change memory cells;
    a first group of direct main bitlines and respective complementary main bitlines coupled to the first programming driver through respective direct and complementary selectors;
    a second group of direct main bitlines and respective complementary main bitlines coupled to the second programming driver through respective direct and complementary selectors;
    the plurality of phase-change memory cells including first direct and complementary memory cells coupled to the direct and respectively complementary main bitlines of the first group and associated with the first programming driver, and second direct and complementary memory cells coupled to the direct and respectively complementary main bitlines of the second group and associated with the second programming driver; and
    each of the first direct and complementary memory cells associated with the first programming driver being uniquely addressable by local bitlines and wordlines, and each of the second direct and complementary memory cells associated with the second programming driver being uniquely addressable by respective local bitlines and wordlines;
    the method comprising the steps of:
        in a first operating condition associated with a first time interval:
            (a) for each one of the first and second groups, activating the direct selectors or the complementary selectors so as to electrically connect each direct or, respectively, complementary main bitline, to the first and second programming drivers thereof;
            (b) addressing, through the local bitlines and wordlines coupled to the first memory cells associated with the first programming driver, a direct memory cell or the respective complementary memory cell, establishing a conductive path between the first programming driver and the first memory cell addressed;
            (c) addressing, through the local bitlines and wordlines coupled to the second memory cells associated with the second programming driver, a direct memory cell or the respective complementary memory cell, establishing a conductive path between the second programming driver and the second memory cell addressed; and (d) supplying, through the first and second programming drivers, a first programming current, of a same type among SET and RESET currents, together with the first and second memory cells addressed in the steps (b) and (c); and in a second operating condition associated with a second time interval different from the first time interval:

(e) for each one of the first and second groups, activating the others of the direct selectors or the complementary selectors activated in the step (a), so as to electrically connect each direct, or, respectively, complementary main bitline, to the first and second programming drivers thereof;

(f) addressing, through the local bitlines and wordlines coupled to the first memory cells associated with the first programming driver, the other direct or complementary memory cell with respect to that addressed in the step (b);

(g) addressing, through the local bitlines and wordlines coupled to the second memory cells associated with the second programming driver, the other direct or complementary memory cell with respect to that addressed in the step (c); and (h) supplying, through the first and second programming drivers, a second programming current, of the other type between SET and RESET currents, together with the first and second memory cells addressed in the steps (f) and (g).

2. The method according to claim 1, wherein:

if the memory cell addressed in the step (b) or in the step (f) is a direct memory cell, generating a first activation signal of the direct selectors associated with the first programming driver, otherwise generating a second activation signal of the complementary selectors associated with the first programming driver;

if the memory cell addressed in the step (c) or in the step (g) is a direct memory cell, generating a third activation signal of the direct selectors associated with the second programming driver, otherwise generating a fourth activation signal of the complementary selectors associated with the second programming driver;

electrically connecting or disconnecting the direct main bitlines to/from the respective first and second programming drivers according to a value assumed by the first and third activation signals; and electrically connecting or disconnecting the complementary main bitlines to/from the respective first and second programming drivers according to a value assumed by the second and fourth activation signals.

3. The method according to claim 2, wherein:

the first and second activation signals are binary logic signals having respective values which are negated to each other; and the third and the fourth activation signals are binary logic signals having respective values which are negated to each other.

4. The method according to claim 2, wherein the phase-change memory device further comprises:

a third group of direct main bitlines and respective complementary main bitlines coupled to the first programming driver through respective direct and complementary selectors;

a fourth group of direct main bitlines and respective complementary main bitlines coupled to the second programming driver through respective direct and complementary selectors;

a first reading stage coupled to the first group of direct main bitlines and respective complementary main bitlines, configured to carry out a differential reading of a logic datum stored in a direct memory cell and in the respective complementary memory cell coupled to the main bitlines of the first group;

a second reading stage coupled to the second group of direct main bitlines and respective complementary main bitlines, configured to carry out a differential reading of a logic datum stored in a direct memory cell and in the respective complementary memory cell coupled to the main bitlines of the second group;

a third reading stage coupled to the third group of direct main bitlines and respective complementary main bitlines, configured to carry out a differential reading of a logic datum stored in a direct memory cell and in the respective complementary memory cell coupled to the main bitlines of the third group; and a fourth reading stage coupled to the fourth group of direct main bitlines and respective complementary main bitlines, configured to carry out a differential reading of a logic datum stored in a direct memory cell and in the respective complementary memory cell coupled to the main bitlines of the fourth group;

the method further comprising the steps of:

generating a first control signal, which is a binary logic signal associated with the first reading stage;

generating a second control signal, which is a binary logic signal associated with the second reading stage;

generating a third control signal, which is a binary logic signal associated with the third reading stage;

generating a fourth control signal, which is a binary logic signal associated with the fourth reading stage; and in response to the memory cell addressed in the step (b) or in the step (f) being a direct memory cell associated with the first reading stage, switching on the direct selectors coupled to the first group of main bitlines according to a first switch-on signal generated by a logic AND operation of the first activation signal and the first control signal;

in response to the memory cell addressed in the step (b) or in the step (f) being a complementary memory cell associated with the first reading stage, switching on the complementary selectors coupled to the first group of main bitlines according to a second switch-on signal generated by a logic AND operation of the second activation signal and the first control signal;

in response to the memory cell addressed in the step (b) or in the step (f) being a direct memory cell associated with the third reading stage, switching on the direct selectors coupled to the third group of main bitlines according to a third switch-on signal generated by a logic AND operation of the first activation signal and the third control signal;

in response to the memory cell addressed in the step (b) or in the step (f) being a complementary memory cell associated with the third reading stage, switching on the complementary selectors coupled to the third group of main bitlines according to a fourth switch-on signal generated by a logic AND operation of the second activation signal and the third control signal;

in response to the memory cell addressed in the step (c) or in the step (g) being a direct memory cell associated with the second reading stage, switching on the direct selectors coupled to the second group of main bitlines according to a fifth switch-on signal generated by a logic AND operation of the second activation signal and the second control signal;

in response to the memory cell addressed in the step (c) or in the step (g) being a complementary memory cell associated with the second reading stage, switching on the complementary selectors coupled to the second group of main bitlines according to a sixth switch-on signal generated by a logic AND operation of the fourth activation signal and the second control signal;

in response to the memory cell addressed in the step (c) or in the step (g) being a direct memory cell associated with the fourth reading stage, switching on the direct selectors coupled to the fourth group of main bitlines according to a seventh switch-on signal generated by a logic AND operation of the second activation signal and the fourth control signal; or in response to the memory cell addressed in the step (c) or in the step (g) being a complementary memory cell associated with the fourth reading stage, switching on the complementary selectors coupled to the fourth group of main bitlines according to an eighth switch-on signal generated by a logic AND operation of the fourth activation signal and the fourth control signal.

5. The method according to claim 4, wherein the direct and complementary selectors coupled to the direct and complementary main bitlines of the first, second, third and fourth groups are p-MOSs, the method further comprising the steps of:

switching on the direct selectors coupled to the first group of main bitlines in response to the first switch-on signal having a logic value "0" and being generated by a negated logic AND operation of the first activation signal having a logic value "1" and the first control signal having a logic value "1"; or switching on the complementary selectors coupled to the first group of main bitlines in response to the second switch-on signal having a logic value "0" and being generated by a negated logic AND operation of the second activation signal having a logic value "1" and the first control signal having a logic value "1";

switching on the direct selectors coupled to the third group of main bitlines in response to the third switch-on signal having a logic value "0" and being generated by a negated logic AND operation of the first activation signal having a logic value "1" and the third control signal having a logic value "1"; or switching on the complementary selectors coupled to the third group of main bitlines in response to the fourth switch-on signal having a logic value "0" and being generated by a negated logic AND operation of the second activation signal having a logic value "1" and the third control signal having a logic value "1";

switching on the direct selectors coupled to the second group of main bitlines in response to the fifth switch-on signal having a logic value "0" and being generated by a negated logic AND operation of the second activation signal having a logic value "1" and the second control signal having a logic value "1"; or switching on the complementary selectors coupled to the second group of main bitlines in response to the sixth switch-on signal having a logic value "0" and being generated by a negated logic AND operation of the fourth activation signal having a logic value "1" and the second control signal having a logic value "1"; and switching on the direct selectors coupled to the fourth group of main bitlines in response to the seventh switch-on signal having a logic value "0" and being generated by a negated logic AND operation of the second activation signal having a logic value "1" and the fourth control signal having a logic value "1"; or switching on the complementary selectors coupled to the fourth group of main bitlines in response to the eighth switch-on signal having a logic value "0" and being generated by a negated logic AND operation of the fourth activation signal having a logic value "1" and the fourth control signal having a logic value "1".

6. The method according to claim 5, wherein:

when the first activation signal has a logic value "1", the second activation signal has a logic value "0", or vice versa;

when the first control signal has a logic value "1", the third control signal has a logic value "0", or vice versa;

when the third activation signal has a logic value "1", the fourth activation signal has a logic value "0", or vice versa; and when the second control signal has a logic value "1", the fourth control signal has a logic value "0", or vice versa.

7. A differential-type phase-change memory, comprising:

a plurality of phase-change memory cells;

a first programming driver of respective phase-change memory cells;

a second programming driver of respective phase-change memory cells;

a first group of direct main bitlines and respective complementary main bitlines coupled to the first programming driver through respective direct and complementary selectors;

a second group of direct main bitlines and respective complementary main bitlines coupled to the second programming driver through respective direct and complementary selectors;

the plurality of phase-change memory cells including first direct and complementary memory cells coupled to the direct and respectively complementary main bitlines of the first group and associated with the first programming driver, and second direct and complementary memory cells coupled to the direct and respectively complementary main bitlines of the second group and associated with the second programming driver; and each of the first direct and complementary memory cells associated with the first programming driver being uniquely addressable by local bitlines and wordlines, and each of the second direct and complementary memory cells associated with the second programming driver being uniquely addressable by respective local bitlines and wordlines, wherein the phase-change memory device is configured for:

in a first operating condition associated with a first time interval:

(a) for each between the first and second groups, activating the direct selectors or the complementary selectors so as to electrically connect each direct or, respectively, complementary main bitline, to the first and second programming drivers thereof;

(b) addressing, through the local bitlines and wordlines coupled to the first memory cells associated with the first programming driver, a direct memory cell or the respective complementary memory cell, establishing a conductive path between the first programming driver and the first memory cell addressed;

(c) addressing, through the local bitlines and wordlines coupled to the second memory cells associated with the second programming driver, a direct memory cell or the respective complementary memory cell, establishing a conductive path between the second programming driver and the second memory cell addressed; and (d) supplying, through the first and second programming drivers, a first programming current, of a same type between SET and RESET currents, together with the first and second memory cells addressed in the steps (b) and (c); and in a second operating condition associated with a second time interval different from the first time interval:

(e) for each between the first and second groups, activating the others between the direct selectors or the complementary selectors activated in the step (a), so as to electrically connect each direct, or, respectively, complementary main bitline, to the first and second programming drivers thereof;

(f) addressing, through the local bitlines and wordlines coupled to the first memory cells associated with the first programming driver, the other direct or complementary memory cell with respect to that addressed in the step (b);

(g) addressing, through the local bitlines and wordlines coupled to the second memory cells associated with the second programming driver, the other direct or complementary memory cell with respect to that addressed in the step (c); and (h) supplying, through the first and second programming drivers, a second programming current, of the other type between SET and RESET currents, together with the first and second memory cells addressed in the steps (f) and (g).

8. The device according to claim 7, further configured for:
if the memory cell addressed in the step (b) or in the step (f) is a direct memory cell, generating a first activation signal of the direct selectors associated with the first programming driver, otherwise generating a second activation signal of the complementary selectors associated with the first programming driver;
if the memory cell addressed in the step (c) or in the step (g) is a direct memory cell, generating a third activation signal of the direct selectors associated with the second programming driver, otherwise generating a fourth activation signal of the complementary selectors associated with the second programming driver;
electrically connecting or disconnecting the direct main bitlines to/from the respective first and second programming drivers according to a value assumed by the first and third activation signals; and
electrically connecting or disconnecting the complementary main bitlines to/from the respective first and second programming drivers according to a value assumed by the second and fourth activation signals.

9. The device according to claim 8, wherein:
the first and second activation signals are binary logic signals having respective values which are negated to each other; and
the third and the fourth activation signals are binary logic signals having respective values which are negated to each other.

10. The device according to claim 8, further comprising:
a third group of direct main bitlines and respective complementary main bitlines coupled to the first programming driver through respective direct and complementary selectors;
a fourth group of direct main bitlines and respective complementary main bitlines coupled to the second programming driver through respective direct and complementary selectors;
a first reading stage coupled to the first group of direct main bitlines and respective complementary main bitlines, configured to carry out a differential reading of a logic datum stored in a direct memory cell and in the respective complementary memory cell coupled to the main bitlines of the first group;
a second reading stage coupled to the second group of direct main bitlines and respective complementary main bitlines, configured to carry out a differential reading of a logic datum stored in a direct memory cell and in the respective complementary memory cell coupled to the main bitlines of the second group;
a third reading stage coupled to the third group of direct main bitlines and respective complementary main bitlines, configured to carry out a differential reading of a logic datum stored in a direct memory cell and in the respective complementary memory cell coupled to the main bitlines of the third group;
a fourth reading stage coupled to the fourth group of direct main bitlines and respective complementary main bitlines, configured to carry out a differential reading of a logic datum stored in a direct memory cell and in the respective complementary memory cell coupled to the main bitlines of the fourth group;
wherein the phase-change memory device is further configured for:
generating a first control signal, which is a binary logic signal associated with the first reading stage;
generating a second control signal, which is a binary logic signal associated with the second reading stage;
generating a third control signal, which is a binary logic signal associated with the third reading stage;
generating a fourth control signal, which is a binary logic signal associated with the fourth reading stage;
if the memory cell addressed in the step (b) or in the step (f) is a direct memory cell associated with the first reading stage, switching on the direct selectors coupled to the first group of main bitlines according to a first switch-on signal generated by a logic AND operation of the first activation signal and the first control signal;
if the memory cell addressed in the step (b) or in the step (f) is a complementary memory cell associated with the first reading stage, switching on the complementary selectors coupled to the first group of main bitlines according to a second switch-on signal generated by a logic AND operation of the second activation signal and the first control signal;

if the memory cell addressed in the step (b) or in the step (f) is a direct memory cell associated with the third reading stage, switching on the direct selectors coupled to the third group of main bitlines according to a third switch-on signal generated by a logic AND operation of the first activation signal and the third control signal;

if the memory cell addressed in the step (b) or in the step (f) is a complementary memory cell associated with the third reading stage, switching on the complementary selectors coupled to the third group of main bitlines according to a fourth switch-on signal generated by a logic AND operation of the second activation signal and the third control signal;

if the memory cell addressed in the step (c) or in the step (g) is a direct memory cell associated with the second reading stage, switching on the direct selectors coupled to the second group of main bitlines according to a fifth switch-on signal generated by a logic AND operation of the second activation signal and the second control signal;

if the memory cell addressed in the step (c) or in the step (g) is a complementary memory cell associated with the second reading stage, switching on the complementary selectors coupled to the second group of main bitlines according to a sixth switch-on signal generated by a logic AND operation of the fourth activation signal and the second control signal;

if the memory cell addressed in the step (c) or in the step (g) is a direct memory cell associated with the fourth reading stage, switching on the direct selectors coupled to the fourth group of main bitlines according to a seventh switch-on signal generated by a logic AND operation of the second activation signal and the fourth control signal; and if the memory cell addressed in the step (c) or in the step (g) is a complementary memory cell associated with the fourth reading stage, switching on the complementary selectors coupled to the fourth group of main bitlines according to an eighth switch-on signal generated by a logic AND operation of the fourth activation signal and the fourth control signal.

11. The device according to claim 10, wherein the direct and complementary selectors coupled to the direct and complementary main bitlines of the first, second, third and fourth groups are p-MOSs, and wherein the phase-change memory device further comprises:

a first NAND logic gate, configured to receive at its inputs the first activation signal and the first control signal and to generate at its output the first switch-on signal, so as to switch on the direct selectors coupled to the first group of main bitlines when the first activation signal has a logic value "1" and the first control signal has a logic value "1";

a second NAND logic gate, configured to receive at its inputs the second activation signal and the first control signal and to generate at its output the second switch-on signal, so as to switch on the complementary selectors coupled to the first group of main bitlines when the second activation signal has a logic value "1" and the first control signal has a logic value "1";

a third NAND logic gate, configured to receive at its inputs the first activation signal and the third control signal and to generate at its output the third switch-on signal, so as to switch on the direct selectors coupled to the third group of main bitlines when the first activation signal has a logic value "1" and the third control signal has a logic value "1";

a fourth NAND logic gate, configured to receive at its inputs the second activation signal and the third control signal and to generate at its output the fourth switch-on signal, so as to switch on the complementary selectors coupled to the third group of main bitlines when the second activation signal has a logic value "1" and the third control signal has a logic value "1";

a fifth NAND logic gate, configured to receive at its inputs the second activation signal and the second control signal and to generate at its output the fifth switch-on signal, so as to switch on the direct selectors coupled to the second group of main bitlines when the second activation signal has a logic value "1" and the second control signal has a logic value "1";

a sixth NAND logic gate, configured to receive at its inputs the fourth activation signal and the second control signal and to generate at its output the sixth switch-on signal, so as to switch on the complementary selectors coupled to the second group of main bitlines when the fourth activation signal has a logic value "1" and the second control signal has a logic value "1";

a seventh NAND logic gate, configured to receive at its inputs the second activation signal and the fourth control signal and to generate at its output the seventh switch-on signal, so as to switch on the direct selectors coupled to the fourth group of main bitlines when the second activation signal has a logic value "1" and the fourth control signal has a logic value "1"; and an eighth NAND logic gate, configured to receive at its inputs the fourth activation signal and the fourth control signal and to generate at its output the eighth switch-on signal, so as to switch on the complementary selectors coupled to the fourth group of main bitlines when the fourth activation signal has a logic value "1" and the fourth control signal has a logic value "1".

12. The device according to claim 11, wherein:

when the first activation signal has a logic value "1", the second activation signal has a logic value "0", and vice versa;

when the first control signal has a logic value "1", the third control signal has a logic value "0", and vice versa;

when the third activation signal has a logic value "1", the fourth activation signal has a logic value "0", and vice versa; and when the second control signal has a logic value "1", the fourth control signal has a logic value "0", and vice versa.

13. An electronic system, comprising:

a bus;

a controller coupled to the bus;

an input/output device coupled to the bus;

a wireless interface coupled to the bus;

a random access memory coupled to the bus; and a differential-type phase-change memory device comprising:

a plurality of phase-change memory cells;

a first programming driver of respective phase-change memory cells;

a second programming driver of respective phase-change memory cells;

a first group of direct main bitlines and respective complementary main bitlines coupled to the first programming driver through respective direct and complementary selectors;

a second group of direct main bitlines and respective complementary main bitlines coupled to the second programming driver through respective direct and complementary selectors;

the plurality of phase-change memory cells including first direct and complementary memory cells coupled to the direct and respectively complementary main bitlines of the first group and associated with the first programming driver, and second direct and complementary memory cells coupled to the direct and respectively complementary main bitlines of the second group and associated with the second programming driver; and each of the first and second direct and complementary memory cells associated with the first programming driver being uniquely addressable by local bitlines and wordlines, and each of the first and second direct and complementary memory cells associated with the second programming driver being uniquely addressable by respective local bitlines and wordlines, wherein the phase-change memory device is configured for:
in a first operating condition associated with a first time interval:
(a) for each between the first and second groups, activating the direct selectors or the complementary selectors so as to electrically connect each direct or, respectively, complementary main bitline, to the first and second programming drivers thereof;
(b) addressing, through the local bitlines and wordlines coupled to the first memory cells associated with the first programming driver, a direct memory cell or the respective complementary memory cell, establishing a conductive path between the first programming driver and the first memory cell addressed;
(c) addressing, through the local bitlines and wordlines coupled to the second memory cells associated with the second programming driver, a direct memory cell or the respective complementary memory cell, establishing a conductive path between the second programming driver and the second memory cell addressed; and
(d) supplying, through the first and second programming drivers, a first programming current, of a same type between SET and RESET currents, together with the first and second memory cells addressed in the steps (b) and (c); and
in a second operating condition associated with a second time interval different from the first time interval:
(e) for each between the first and second groups, activating the others between the direct selectors or the complementary selectors activated in the step (a), so as to electrically connect each direct, or, respectively, complementary main bitline, to the first and second programming drivers thereof;
(f) addressing, through the local bitlines and wordlines coupled to the first memory cells associated with the first programming driver, the other direct or complementary memory cell with respect to that addressed in the step (b);
(g) addressing, through the local bitlines and wordlines coupled to the second memory cells associated with the second programming driver, the other direct or complementary memory cell with respect to that addressed in the step (c); and
(h) supplying, through the first and second programming drivers, a second programming current, of the other type between SET and RESET currents, together with the first and second memory cells addressed in the steps (f) and (g).

14. The electronic system according to claim 13, wherein the electronic system is a personal digital assistant (PDA), a laptop, a mobile phone, a smartphone, a tablet, a digital audio player, or a camera.

15. The electronic system according to claim 13, wherein the phase-change memory device is further configured for:
if the memory cell addressed in the step (b) or in the step (f) is a direct memory cell, generating a first activation signal of the direct selectors associated with the first programming driver, otherwise generating a second activation signal of the complementary selectors associated with the first programming driver;
if the memory cell addressed in the step (c) or in the step (g) is a direct memory cell, generating a third activation signal of the direct selectors associated with the second programming driver, otherwise generating a fourth activation signal of the complementary selectors associated with the second programming driver;
electrically connecting or disconnecting the direct main bitlines to/from the respective first and second programming drivers according to a value assumed by the first and third activation signals; and
electrically connecting or disconnecting the complementary main bitlines to/from the respective first and second programming drivers according to a value assumed by the second and fourth activation signals.

16. The electronic system according to claim 15, wherein:
the first and second activation signals are binary logic signals having respective values which are negated to each other; and
the third and the fourth activation signals are binary logic signals having respective values which are negated to each other.

17. The electronic system according to claim 15, wherein the phase-change memory device further comprises:
a third group of direct main bitlines and respective complementary main bitlines coupled to the first programming driver through respective direct and complementary selectors;
a fourth group of direct main bitlines and respective complementary main bitlines coupled to the second programming driver through respective direct and complementary selectors;
a first reading stage coupled to the first group of direct main bitlines and respective complementary main bitlines, configured to carry out a differential reading of a logic datum stored in a direct memory cell and in the respective complementary memory cell coupled to the main bitlines of the first group;
a second reading stage coupled to the second group of direct main bitlines and respective complementary main bitlines, configured to carry out a differential reading of a logic datum stored in a direct memory cell and in the respective complementary memory cell coupled to the main bitlines of the second group;
a third reading stage coupled to the third group of direct main bitlines and respective complementary main bitlines, configured to carry out a differential reading of a logic datum stored in a direct memory cell and in the respective complementary memory cell coupled to the main bitlines of the third group;
a fourth reading stage coupled to the fourth group of direct main bitlines and respective complementary main bitlines, configured to carry out a differential reading of a logic datum stored in a direct memory cell and in the respective complementary memory cell coupled to the main bitlines of the fourth group;
wherein the phase-change memory device is further configured for:
  generating a first control signal, which is a binary logic signal associated with the first reading stage;
  generating a second control signal, which is a binary logic signal associated with the second reading stage;
  generating a third control signal, which is a binary logic signal associated with the third reading stage;
  generating a fourth control signal, which is a binary logic signal associated with the fourth reading stage;
  if the memory cell addressed in the step (b) or in the step (f) is a direct memory cell associated with the first reading stage, switching on the direct selectors coupled to the first group of main bitlines according to a first switch-on signal generated by a logic AND operation of the first activation signal and the first control signal;
  if the memory cell addressed in the step (b) or in the step (f) is a complementary memory cell associated with the first reading stage, switching on the complementary selectors coupled to the first group of main bitlines according to a second switch-on signal generated by a logic AND operation of the second activation signal and the first control signal;
  if the memory cell addressed in the step (b) or in the step (f) is a direct memory cell associated with the third reading stage, switching on the direct selectors coupled to the third group of main bitlines according to a third switch-on signal generated by a logic AND operation of the first activation signal and the third control signal;
  if the memory cell addressed in the step (b) or in the step (f) is a complementary memory cell associated with the third reading stage, switching on the complementary selectors coupled to the third group of main bitlines according to a fourth switch-on signal generated by a logic AND operation of the second activation signal and the third control signal;
  if the memory cell addressed in the step (c) or in the step (g) is a direct memory cell associated with the second reading stage, switching on the direct selectors coupled to the second group of main bitlines according to a fifth switch-on signal generated by a logic AND operation of the second activation signal and the second control signal;
  if the memory cell addressed in the step (c) or in the step (g) is a complementary memory cell associated with the second reading stage, switching on the complementary selectors coupled to the second group of main bitlines according to a sixth switch-on signal generated by a logic AND operation of the fourth activation signal and the second control signal;
  if the memory cell addressed in the step (c) or in the step (g) is a direct memory cell associated with the fourth reading stage, switching on the direct selectors coupled to the fourth group of main bitlines according to a seventh switch-on signal generated by a logic AND operation of the second activation signal and the fourth control signal; and
  if the memory cell addressed in the step (c) or in the step (g) is a complementary memory cell associated with the fourth reading stage, switching on the complementary selectors coupled to the fourth group of main bitlines according to an eighth switch-on signal generated by a logic AND operation of the fourth activation signal and the fourth control signal.

18. The electronic system according to claim 17, wherein the direct and complementary selectors coupled to the direct and complementary main bitlines of the first, second, third and fourth groups are p-MOSs, and wherein the phase-change memory device further comprises:
  a first NAND logic gate, configured to receive at its inputs the first activation signal and the first control signal and to generate at its output the first switch-on signal, so as to switch on the direct selectors coupled to the first group of main bitlines when the first activation signal has a logic value "1" and the first control signal has a logic value "1";
  a second NAND logic gate, configured to receive at its inputs the second activation signal and the first control signal and to generate at its output the second switch-on signal, so as to switch on the complementary selectors coupled to the first group of main bitlines when the second activation signal has a logic value "1" and the first control signal has a logic value "1";
  a third NAND logic gate, configured to receive at its inputs the first activation signal and the third control signal and to generate at its output the third switch-on signal, so as to switch on the direct selectors coupled to the third group of main bitlines when the first activation signal has a logic value "1" and the third control signal has a logic value "1";
  a fourth NAND logic gate, configured to receive at its inputs the second activation signal and the third control signal and to generate at its output the fourth switch-on signal, so as to switch on the complementary selectors coupled to the third group of main bitlines when the second activation signal has a logic value "1" and the third control signal has a logic value "1";
  a fifth NAND logic gate, configured to receive at its inputs the second activation signal and the second control signal and to generate at its output the fifth switch-on signal, so as to switch on the direct selectors coupled to the second group of main bitlines when the second activation signal has a logic value "1" and the second control signal has a logic value "1";
  a sixth NAND logic gate, configured to receive at its inputs the fourth activation signal and the second control signal and to generate at its output the sixth switch-on signal, so as to switch on the complementary selectors coupled to the second group of main bitlines when the fourth activation signal has a logic value "1" and the second control signal has a logic value "1";
  a seventh NAND logic gate, configured to receive at its inputs the second activation signal and the fourth control signal and to generate at its output the seventh switch-on signal, so as to switch on the direct selectors coupled to the fourth group of main bitlines when the second activation signal has a logic value "1" and the fourth control signal has a logic value "1"; and an eighth NAND logic gate, configured to receive at its inputs the fourth activation signal and the fourth control signal and to generate at its output the eighth switch-on signal, so as to switch on the complementary selectors coupled to the fourth group of main bitlines when the fourth activation signal has a logic value "1" and the fourth control signal has a logic value "1".

19. The electronic system according to claim 18, wherein:

when the first activation signal has a logic value "1", the second activation signal has a logic value "0", and vice versa;

when the first control signal has a logic value "1", the third control signal has a logic value "0", and vice versa;

when the third activation signal has a logic value "1", the fourth activation signal has a logic value "0", and vice versa; and when the second control signal has a logic value "1", the fourth control signal has a logic value "0", and vice versa.

20. The electronic system of claim 13, further comprising:

a battery configured to power the electronic system; and a camera coupled to the bus.

\* \* \* \* \*